April 5, 1966 M. S. LEIFER 3,244,910
ELECTRIC SWITCHING CIRCUIT
Filed April 18, 1963
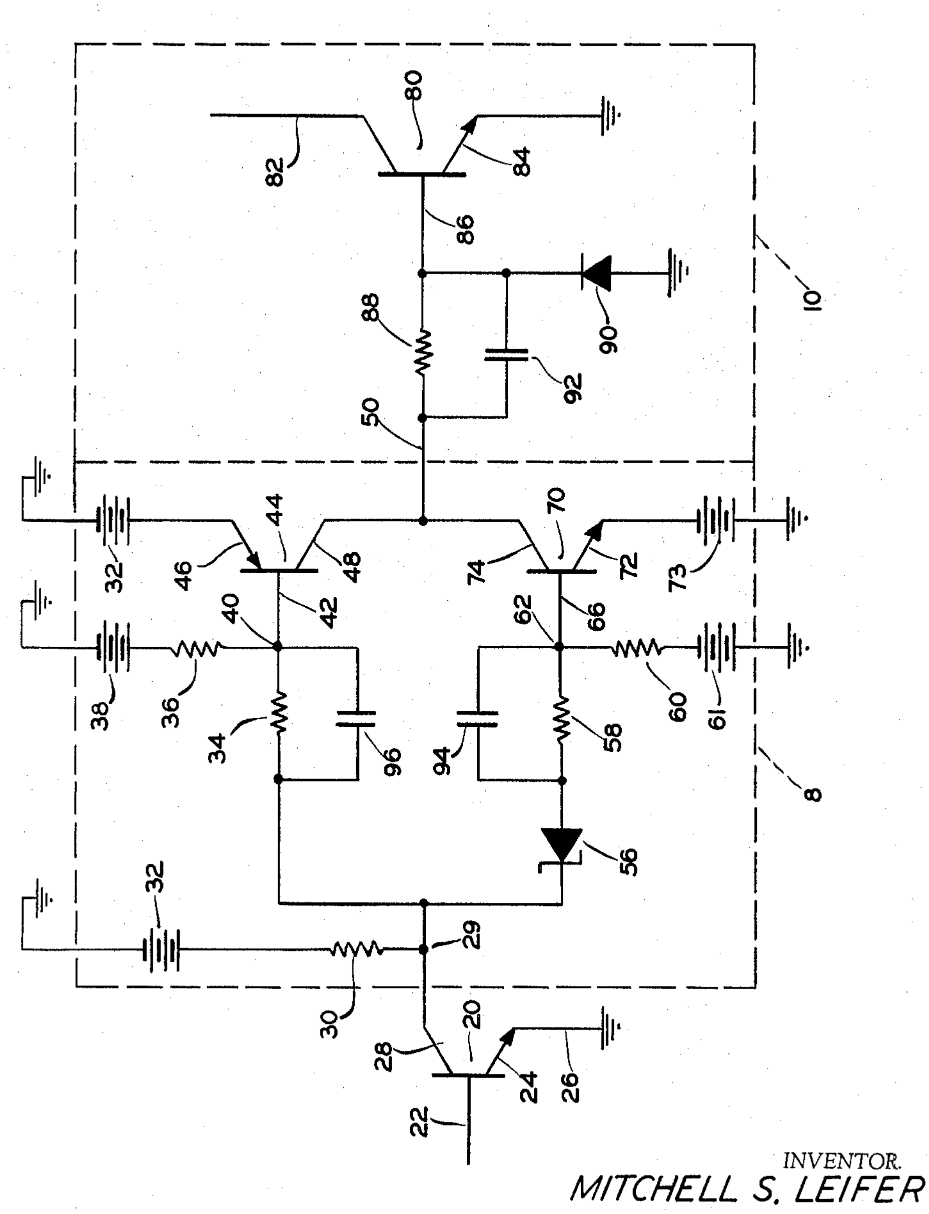
INVENTOR.
MITCHELL S. LEIFER
BY
ATTORNEY 3,244,910
ELECTRIC SWITCHING CIRCUIT
Mitchell S. Leifer, Forest Hills, N.Y., assignor to The Bendix Corporation, Teterboro, N.J., a corporation of Delaware
Filed Apr. 18, 1963, Ser. No. 273,994
7 Claims. (Cl. 307—88.5)

The invention relates generally to electric circuits and in particular to a circuit for switching moderately large current at a fast repetition rate.

An object of the invention is to provide a current switching circuit having a high efficiency and a high speed.

Another object of the invention is to provide a novel transistor switching circuit having a drive stage, and a switching stage which demands a small amount of current from the drive stage.

Another object of the invention is to provide a novel drive circuit providing a fast switching action and employing in a novel fashion a zener diode.

Another object of the invention is to provide a drive circuit having a low output impedance particularly well adapted to drive a subsequent stage having a large capacitive input.

Another object of the invention is to provide a drive circuit with complementary transistors thereby avoiding the use of load resistors and an associated power loss.

These and other objects and features of the invention are pointed out in the following description in terms of the embodiment thereof which is shown in the accompanying drawing. It is to be understood, however, that the drawing is for the purpose of illustration only and is not a definition of the limits of the invention, reference being had to the appended claims for this purpose.

In the drawings there is shown a schematic diagram of a circuit constructed in accordance with the invention. The circuit comprises a drive stage 8, shown driving a transistor in a switching stage 10.

An alternating input signal which, for example, may be 8 megacycles is applied to a transistor 20 at its base 22. The transistor 20 has an emitter 24 connected to a ground potential 26, and a collector 28 connected to a junction point 29. The alternating signal input applied to base 22 is sufficient to render the transistor 20 in either a conducting state, i.e. in saturation or in a nonconducting state, i.e. at cutoff, thus providing between the collector 28 and emitter 24 a virtual short circuit or a virtual open circuit.

The collector 28 is connected through a current limiting resistor 30 to a first source of potential 32 which, for example, may be +12 volts, and is shown here as a battery.

The collector 28 is also connected through a pair of resistors 34 and 36 to a second source of potential 38, which, for example, may be +18 volts and is shown here as a battery. The resistors 34 and 36 form a divider having an output at their junction 40 which is connected to the control terminal or base 42 of a transistor 44. The transistor is shown here as a PNP type, and has its emitter 46 connected to the first source of potential 32 shown here in the example as +12 volts, and its collector 48 connected to an output terminal or conductor 50. The values of this pair of divider resistors 34 and 36 is such as to provide, when transistor 20 is in a conducting state, a potential at the output junction 40 sufficient to render transistor 44 in a conducting state. For example, resistor 34 may be 2.2 kilohms and resistor 36, 5.6 kilohms; with transistor 20 as a virtual short circuit (i.e. fully conducting) there is provided a potential of approximately 11 volts at junction 40 and to the base 42. Since the base 42 has a lower potential than the emitter 46, transistor 44 is rendered conducting. As will be shown below, when the transistor 20 is in a nonconducting state, the potential at the output junction 40 of the pair of divider resistors 34 and 36 is approximately 14 volts. Thus the base 42 has a higher potential than the emitter 46 and the transistor 44 is held beyond cutoff in a nonconducting condition.

The collector 28 of transistor 20 is also connected through a zener diode 56 (which, for example, may have a zener or breakdown voltage of 7 volts) and a pair of resistors 58 and 60 to a third source of potential 61 which is negative and may, for example, be −12 volts, and is shown here as a battery. The resistors 58 and 60 form a divider circuit having a junction 62 which is connected to a base or control terminal 66 of a third transistor 70. Transistor 70 is an NPN transistor having an emitter 72 connected to a fourth source of potential 73 which is less in magnitude than the third source of potential and, for example, may be −3 volts and is shown here as a battery. The transistor 70 also has a collector 74 which is connected to the output conductor 50.

When the transistor 20 is in a conducting state, its collector is at almost zero potential. The values of the resistors 58 and 60 are chosen such as to provide at the output 62 to the base 66 of transistor 70 a potential more negative than the potential of the fourth source 73 to hold the transistor 70 in a nonconducting state. For example, resistor 58 may be 1.6 kilohms and resistor 60, 13 kilohms. Zener diode 56 absorbs a 7 volt potential drop, thus there is provided across resistor 60 a potential drop a little less than 5 volts, so that there is at the output 62 of the divider a potential of approximately −7 volts.

When the transistor 20 is in a nonconducting state, it may be considered as an open circuit from collector 28 to emitter 24. Continuing with the example values above described, and by summing the currents at the junction 29, it will be appreciated that the potential there (at junction 29) is approximately +12 volts. Thus, there is a potential drop across the first pair of divider resistors 34 and 36 of approximately 6 volts, and there is maintained at the output junction 40 of the divider resistors a voltage of approximately +14 volts. The 14 volts on base 42 is more positive than the potential from the second source provided on emitter 46 (i.e. 12 volts) and transistor 44 is rendered beyond cutoff in a nonconducting condition.

Across the second pair of divider resistors 58 and 60, and the zener diode 56, there is now provided approximately 24 volts. The zener diodes 56 absorb 7 volts and the remaining 17 volts are divided across the resistors 60 and 58 providing approximately −1 volt at the output junction 62 to base 66 of the transistor 70. The transistor 70 now has its base 66 at a higher potential than its emitter 72 and is rendered in a saturation region and is fully conducting.

Thus, in summary, the driver stage 8 receives an alternating signal on the base 22 of transistor 20 which renders that transistor 20 in a conducting or a nonconducting condition. The output conductor 50 receives a current from the source 32 through the transistor 44 when the transistor 20 is conducting. The output 50 is disconnected from the source 32 when the input signal renders the transistor 20 nonconducting, because transistor 44 is now nonconducting; but the output 50 is then connected to the negative potential 73 through a virtual short circuit of transistor 70 which is conducting. Thus there is provided on output conductor 50 a square wave and in the example shown it varies between +12 volts and −3 volts.

It should be noted that the output impedances on conductor 50 is extremely low, and is equal to approximately the saturation resistance of the transistors being used: for example, it may be approximately 5 ohms.

The rising and falling portion of the waveform is only limited by the switching speed of the complementary transistors 44 and 70. As the signals applied to these bases are sufficiently large to drive them well into either the cutoff or saturation region, the only limiting factor on the rise time and fall time on the output signal provided on conductor 50 is the inherent limitation of transistors 44 and 70 themselves; and the load to which conductor 50 is connected.

The driver stage 8 is shown driving a switching circuit 10 which includes a transistor 80 having a collector 82 connected to a source of potential (not shown) and an emitter 84 which is directly connected to ground potential. A load (not shown) may be connected in the collector circuit 82 or may be added to the emitter circuit 84. The transistor 80 has a base 86 connected through a current limiting resistor 88 to the output 50 of the driver stage. A diode 90 is connected backbiased from the base 86 to ground potential. The transistor 80 may be selected as one capable of handling large currents, for example, on the order of 380 milliamperes. To switch current of such size efficiently, the base current to the transistor 80 should be large to hold the transistor well into a saturation. It is desirable that available current be applied to the base 86 through as large a resistance (resistor 88) as possible to avoid power loss, and also that all power available for biasing the transistor 80 should be applied thereto. It will be noticed that the diode 90 is used between the base 86 and ground to achieve efficient operation.

The switching transistor stage 10 behaves as a conventional amplifier. When the output signal from the driver stage on the conductor 50 is a positive potential, i.e. in the example +12 volts, the diode 90 is backbiased and the full +12 volts is applied to base 86 of transistor 80. The 12 volt potential drop between base 86 and emitter 84 is sufficient to drive the transistor well into the saturation region and to full conduction. The transistor 80 is thus fully conducting. When the output signal from the driver stage available on conductor 50 falls to a negative potential, i.e. in the example, —3 volts, the base 86 is brought to a negative potential sweeping any charges from the base region 86. With the aid of diode 90, transistor 80 is forcefully pulled into the cutoff region and is rendered completely nonconducting.

To improve the switching speeds the resistors 88, 58, and 34 are individually shunted by capacitors 92, 94, and 96 respectively. These capacitors pass the initial pulse and enhance high speed switching.

The circuit shown in the figure has operated satisfactorily at approximately 8 megacycles and an output waveform shows a rise time of approximately 20 nanoseconds measured between the 10% and 90% values of the output waveform.

There are many different values of circuit parameters for which the circuit of the figure will function satisfactorily. Since the circuit parameters vary according to the design for any particular application, the following additional circuit parameters are included for use with the example values already given for the circuit of the figure by way of further example only.

Transistor 20: 2N706A
Transistor 40: 2N2412
Transistor 70: 2N914
Transistor 30: 2N2477
Diode 56: 1N707
Diode 90: 1N914
Capacitor 92: 50 picafarads
Capacitors 94 and 96: 20 picafarads Although the circuit has been shown with specific values for purposes of illustration and to add to the description of these specifications, it should be borne in mind that modifications may be made in both the details of the circuit and in the values of the components. The germane relationships are that the output complementary transistor should receive base potentials to render them fully conducting while the other complementary transistor has a base potential to render it fully non-conducting in accordance with the signal applied to the input transistor 20.

In summary, there has been shown a driver circuit adapted to receive a signal and provide a shaped output signal with good rise and fall time of adjustable amplitude levels, and with a very low output impedance. The driver stage is connected to a switching transistor stage and drives a single transistor having an output with improved rise and fall time and capabilities of handling large currents.

Although only one embodiment of the invention has been illustrated and described, various changes in the form and relative arrangements of the parts, which will now appear to those skilled in the art may be made without departing from the scope of the invention. Reference, is therefore, to be had to the appended claims for a definition of the limits of the invention.

What is claimed is:

1. A current switching circuit comprising in combination a drive stage having an input providing an output voltage characterized by two discrete amplitude levels of different polarity; a source of potential; a transistor having a collector and an emitter interconnected with said source of potential and having a base; a current limiting resistor connecting the base of the transistor to the output of the drive stage for passing a current proportional to the output voltage therethrough to render the transistor in a saturation and a cutoff region in accordance therewith, and a diode interconnecting the base of the transistor with the source of potential and backbiased while the transistor is in saturation and forward biased while the transistor is in cutoff.

2. A current switching circuit comprising in combination a drive stage providing an output signal characterized by two discrete amplitude levels, a source of potential, a transistor having a collector and an emitter interconnected with said source of potential and having a base connected to the output of the drive stage to receive the signal therefrom and adapted to be saturated and cutoff in accordance with said output signal, and a diode interconnected with the base and the source of potential to maintain a maximum current flow at the base while the transistor is in saturation.

3. An electric circuit comprising a pair of transistors of opposite conductive types having collectors connected together to provide an output thereat, and emitters connected across a potential difference with the emitter of the first transistor being at a more positive potential than the emitter of the second transistor, said transistors also having bases; a first pair of resistors connecting the bases of the first and second transistors respectively to sources of potential which are respectively more positive and more negative than the potentials provided to the emitters of the transistors; a second pair of resistors connecting the bases to a junction point; a third transistor having at least a collector connected to the junction point, and having a base adapted to receive an input signal rendering the transistor in a conducting or nonconducting condition; and a zener diode connected in series with at least one of resistors of the second pair for regulating the potential at the base of the transistor associated with that resistor.

4. In the electric circuit of the kind defined in claim 3, first and second capacitors in parallel respectively with the resistors of the second pair of resistors for providing fast operation of the circuit.

5. A circuit comprising in combination a first transistor having a base adapted to receive a signal to render it conducting or nonconducting, and having a collector; first and second sources of potential; a first pair of divider resistors connecting the first source of potential to the collector of the first transistor; a second transistor having its base connected to a junction of the resistors of the first pair and receive thereat a control voltage to render the second transistor in a conducting or nonconducting state, said second transistor having its collector connected to an output; a zener diode and a second pair of divider resistors connecting the second source of potential to the collector of the first transistor; a third transistor having its base connected to a junction of the second pair of divider resistors for receiving thereat a control voltage for rendering the third transistor in a conducting or nonconducting state, and the third transistor having a collector connected to the output; said first transistor when in a conducting state rendering its collector at a reference ground potential and when in a nonconducting state maintaining said collector at another potential thereby controlling the potentials at the junctions for selectively rendering one of the second and third transistors in a conducting state and the other in a nonconducting state, thus selectively connecting to the output an output voltage equal to the first and second potentials.

6. A circuit comprising in combination a first transistor having a base adapted to receive a signal to render it conducting or nonconducting, and having a collector; first and second sources of potential; a first pair of divider resistors connecting the first source of potential to the collector of the first transistor; a second transistor having its base connected to a junction of the resistors of the first pair and receive thereat a control voltage to render the second transistor in a conducting or nonconducting state, and said second transistor having its collector connected to an output; a zener diode and a second pair of divider resistors connecting the second source of potential to the collector of the first transistor; a third transistor having its base connected to a junction of the second pair of divider resistors for receiving thereat a control voltage for rendering the third transistor in a conducting or nonconducting state, and the third transistor a collector connected to the output; said first transistor when in a conducting state rendering its collector at a reference potential and when in a nonconducting state maintaining said collector at another potential thereby controlling the potential at the junctions for selectively rendering one of the second and third transistors in a conducting state and the other in a nonconducting state, thus selectively connecting to the output a high or low output potential, and a fourth transistor having a collector and an emitter interconnected with another source of potential, and having a base; a current limiting resistor connecting the base of the fourth transistor to the output for receiving a current proportional to the output potential provided thereon to render the fourth transistor in a saturation and a cutoff region in accordance therewith; and a diode interconnected with the base and the source of potential to maintain a maximum current flow at the base while the fourth transistor is in saturation.

7. A circuit comprising in combination a first transistor having a base for receiving a signal to render it conducting or non-conducting and having a collector, first and second sources of potential, a first pair of divider resistors connecting the first source of potential to the collector of the first transistor, a second transistor having its base connected to a junction of the resistors of the first pair and its emitter connected to the first source of potential, a second pair of divider resistors connecting the second source of potential to the collector of the first transistor, a third transistor having its base connected to a junction of the second pair of divider resistors and its emitter connected to the second source of potential, the second and third transistors having their collectors connected to an output, the first transistor when in a conducting state rendering its collector at one potential and when in a non-conducting state rendering its collector at another potential thereby controlling the potential at the junctions for selectively rendering one of the second or third transistors in a conducting state and the other in a non-conducting state to provide a high or low potential at the output.

References Cited by the Examiner

UNITED STATES PATENTS

| | | | |
|---|---|---|---|
| 3,089,962 | 5/1963 | Foote | 307—88.5 |
| 3,160,765 | 12/1964 | Krossa | 307—88.5 |
| 3,160,766 | 12/1964 | Reymond | 307—88.5 |
| 3,164,826 | 1/1965 | McGrogan | 307—88.5 |

ARTHUR GAUSS, *Primary Examiner.*

J. BUSCH, *Assistant Examiner.*